(12) United States Patent
Park et al.

(10) Patent No.: US 9,190,488 B1
(45) Date of Patent: Nov. 17, 2015

(54) METHODS OF FORMING GATE STRUCTURE OF SEMICONDUCTOR DEVICES AND THE RESULTING DEVICES

(71) Applicant: GLOBALFOUNDRIES Inc., Grand Cayman (KY)

(72) Inventors: Chanro Park, Clifton Park, NY (US); Hoon Kim, Clifton Park, NY (US); Min Gyu Sung, Latham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/458,633

(22) Filed: Aug. 13, 2014

(51) Int. Cl.
| | |
|---|---|
| H01L 29/66 | (2006.01) |
| H01L 27/088 | (2006.01) |
| H01L 29/49 | (2006.01) |
| H01L 29/51 | (2006.01) |
| H01L 21/8234 | (2006.01) |
| H01L 21/28 | (2006.01) |
| H01L 21/3213 | (2006.01) |
| H01L 21/285 | (2006.01) |

(52) U.S. Cl.
CPC .... *H01L 29/66545* (2013.01); *H01L 21/28088* (2013.01); *H01L 21/28568* (2013.01); *H01L 21/32139* (2013.01); *H01L 21/823437* (2013.01); *H01L 27/088* (2013.01); *H01L 29/4966* (2013.01); *H01L 29/517* (2013.01)

(58) Field of Classification Search
USPC ................................................ 257/391, 392
See application file for complete search history.

(56) References Cited

U.S. PATENT DOCUMENTS

| | | | | |
|---|---|---|---|---|
| 6,528,386 | B1* | 3/2003 | Summerfelt et al. | 438/401 |
| 7,078,282 | B2* | 7/2006 | Chau et al. | 438/183 |
| 8,119,461 | B2* | 2/2012 | Trentzsch et al. | 438/143 |
| 8,253,188 | B2* | 8/2012 | Kamigaichi et al. | 257/324 |
| 8,420,519 | B1* | 4/2013 | Triyoso et al. | 438/592 |
| 8,536,040 | B1* | 9/2013 | Park | 438/592 |
| 8,659,084 | B1* | 2/2014 | Chang et al. | 257/347 |
| 8,741,753 | B2* | 6/2014 | Choi et al. | 438/586 |
| 9,012,319 | B1* | 4/2015 | Choi et al. | 438/591 |
| 2005/0260782 | A1* | 11/2005 | Hunter | 438/50 |
| 2007/0037343 | A1* | 2/2007 | Colombo et al. | 438/231 |
| 2007/0145430 | A1* | 6/2007 | Sandhu et al. | 257/288 |
| 2009/0057769 | A1* | 3/2009 | Wei et al. | 257/369 |
| 2009/0087974 | A1* | 4/2009 | Waite et al. | 438/592 |
| 2010/0244141 | A1* | 9/2010 | Beyer et al. | 257/369 |
| 2010/0301427 | A1* | 12/2010 | Lenski et al. | 257/392 |
| 2011/0101470 | A1* | 5/2011 | Hempel et al. | 257/410 |
| 2011/0147858 | A1* | 6/2011 | Lim et al. | 257/412 |
| 2011/0241086 | A1* | 10/2011 | Kurz et al. | 257/288 |
| 2012/0139061 | A1* | 6/2012 | Ramachandran et al. | 257/410 |
| 2012/0313178 | A1* | 12/2012 | Liao et al. | 257/368 |

(Continued)

*Primary Examiner* — Matthew Landau
*Assistant Examiner* — Grant Withers
(74) *Attorney, Agent, or Firm* — Amerson Law Firm, PLLC

(57) ABSTRACT

One method disclosed includes forming a replacement gate structure for a device. The method includes forming a gate cavity above a semiconductor substrate. The method further includes forming a first bulk metal layer in the gate cavity above a work function metal layer. The method further includes forming a conductive etch stop layer in the gate cavity above the first bulk metal layer. The method further includes forming a second bulk metal layer in the gate cavity above the conductive etch stop layer. The method further includes performing at least one etching process to recess the first and second bulk metal layers selectively relative to the conductive etch stop layer. The method further includes performing at least one etching process to recess at least the conductive etch stop layer.

13 Claims, 6 Drawing Sheets

(56) References Cited

U.S. PATENT DOCUMENTS

| | | | |
|---|---|---|---|
| 2013/0043592 A1* | 2/2013 | Park et al. | 257/754 |
| 2013/0056837 A1* | 3/2013 | Ng et al. | 257/410 |
| 2013/0277767 A1* | 10/2013 | Li et al. | 257/411 |
| 2013/0299922 A1* | 11/2013 | Choi et al. | 257/412 |
| 2014/0008720 A1* | 1/2014 | Xie et al. | 257/331 |
| 2014/0061918 A1* | 3/2014 | Jezewski et al. | 257/751 |
| 2014/0110778 A1* | 4/2014 | Fumitake | 257/330 |
| 2014/0124874 A1* | 5/2014 | Mehrotra et al. | 257/410 |
| 2014/0134836 A1* | 5/2014 | Pranatharthiharan et al. | 438/586 |
| 2014/0154877 A1* | 6/2014 | Besser et al. | 438/586 |
| 2014/0319620 A1* | 10/2014 | Hoentschel et al. | 257/379 |
| 2014/0339645 A1* | 11/2014 | Lian | 257/392 |
| 2014/0361353 A1* | 12/2014 | Yin et al. | 257/288 |
| 2014/0367788 A1* | 12/2014 | Xie et al. | 257/369 |
| 2015/0061027 A1* | 3/2015 | Hong et al. | 257/369 |
| 2015/0076624 A1* | 3/2015 | Liu et al. | 257/412 |
| 2015/0108577 A1* | 4/2015 | Cai et al. | 257/369 |

* cited by examiner

METHODS OF FORMING GATE STRUCTURE OF SEMICONDUCTOR DEVICES AND THE RESULTING DEVICES

BACKGROUND OF THE INVENTION

1. Field of the Invention

The present disclosure generally relates to the formation of semiconductor devices, and, more specifically, to various methods of forming gate structures of semiconductor devices and the resulting devices.

2. Description of the Related Art

The fabrication of advanced integrated circuits, such as CPUs, storage devices, ASICs (application specific integrated circuits) and the like, requires the formation of a large number of circuit elements in a given chip area according to a specified circuit layout, wherein so-called metal oxide semiconductor field effect transistors (MOSFETs or FETs) represent one important type of circuit element that substantially determines performance of the integrated circuits. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices.

Field effect transistors, whether an NMOS or a PMOS device, typically include a source region, a drain region, a channel region that is positioned between the source region and the drain region, and a gate electrode positioned above the channel region. Current flow through the FET is controlled by controlling the voltage applied to the gate electrode. For an NMOS device, if there is no voltage (or a logically low voltage) applied to the gate electrode, then there is no current flow through the device (ignoring undesirable leakage currents, which are relatively small). However, when an appropriate positive voltage (or logically high voltage) is applied to the gate electrode, the channel region of the NMOS device becomes conductive, and electrical current is permitted to flow between the source region and the drain region through the conductive channel region. For a PMOS device, the control voltages are reversed. Field effect transistors may come in a variety of different physical shapes, e.g., so-called planar FET devices or so-called 3D or FinFET devices.

For many early device technology generations, the gate structures of most transistor elements have included a plurality of silicon-based materials, such as a silicon dioxide and/or silicon oxynitride gate insulation layer, in combination with a polysilicon gate electrode. However, as the channel length of aggressively scaled transistor elements has become increasingly small, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

In many cases, the metal-containing gate structures are formed by performing well-known replacement gate processing techniques. In general, the replacement gate technique involves forming a sacrificial gate structure (e.g., a silicon dioxide gate insulating layer and a polysilicon gate electrode) and a gate cap layer, followed by forming a protective sidewall spacer adjacent the gate structure. The sacrificial gate structure is eventually removed to define a replacement gate cavity between the spacer. Thereafter, the high-k gate insulating layer and the various layers of metal that will comprise the gate electrode are sequentially deposited in the gate cavity. Excess materials positioned outside of the gate cavity are removed by performing one or more CMP process operations. Next, one or more recess etching processing operations are performed to remove some of the materials within the gate cavity to create a space for the formation of a protective gate cap layer. The gate cap layer is formed by overfilling the recessed cavity with a material, such as silicon nitride, and thereafter performing a CMP process to remove the excess gate cap materials.

In modern device fabrication, transistors having relative short channel lengths and transistors having relatively long channel lengths are formed on the same substrate. Unfortunately, some of the metal materials employed in such metal gate structures, such as tungsten, have different etch characteristics depending upon the channel length of the transistor device, due to differences in grain sizes. Accordingly, during the recess etching process that is performed to make room for the gate cap layer above the replacement metal-containing gate structure, some of the gate structure materials may be inadvertently removed or etched, leading to poor device performance or lower yield. More specifically, etching the gate structures of devices having different channel lengths may result in uneven and inadvertent etching of at least the metal gate materials, such as tungsten or the like, due to the larger grain size and surface area of the metal material in the longer channel devices.

The present disclosure is directed to various methods of forming gate structures of semiconductor devices and the resulting devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming gate structures of semiconductor devices and the resulting devices. One method disclosed includes forming a replacement gate structure for a device. The method includes forming a gate cavity above a semiconductor substrate. The method further includes forming a high-k gate insulation layer in the gate cavity above the substrate. The method further includes forming a work function metal layer in the gate cavity above the high-k gate insulation layer. The method further includes forming a first bulk metal layer in the gate cavity above the work function metal layer. The method further includes forming a conductive etch stop layer in the gate cavity above the first bulk metal layer. The method further includes forming a second bulk metal layer in the gate cavity above the conductive etch stop layer. The method further includes performing at least one etching process to recess the first and second bulk metal layers selectively relative to the conductive etch stop layer. The method further includes performing at least one etching process to recess at least the conductive etch stop layer.

An illustrative gate structure of a transistor device disclosed herein includes a high-k gate insulation layer and a work function metal layer positioned on the high-k gate insulation layer. The device further includes a first bulk metal layer positioned on the work function metal layer. The device further includes a second bulk metal layer. The first and second bulk metal layers have upper surfaces that are at substantially the same height level, and the first and second bulk metal layers are made of substantially the same material. The device further includes a conductive etch stop layer between the first and second bulk metal layers.

Another illustrative method disclosed herein includes forming replacement gate structures for first and second devices. The first device is a short channel device, and the second device is a long channel device. The method includes forming a first and a second gate cavity above a semiconductor substrate for the first and second devices, respectively. The first gate cavity is narrower than the second gate cavity. The method further includes forming a high-k gate insulation layer within the first and second gate cavities. The method further includes forming a work function metal layer within the first and second gate cavities above the high-k gate insulation layer. The method further includes forming a first bulk metal layer within the first and second gate cavities. The first bulk metal layer overfills the first gate cavity but only partially fills the second gate cavity. The method further includes performing a conformal deposition process to form a conductive etch stop layer above the first bulk metal layer within the second gate cavity. The method further includes forming a second bulk metal layer above the conductive etch stop layer within the second gate cavity. The second bulk metal layer overfills the second gate cavity. The method further includes performing at least one etching process to recess the first bulk metal layer within the first gate cavity and to recess the first and second bulk metal layers within the second gate cavity. The method further includes performing at least one etching process to recess the conductive etch stop layer within the second gate cavity.

Another illustrative device disclosed herein includes an integrated circuit device including a gate structure of a short channel device including a high-k gate insulation layer, a work function metal layer positioned on the high-k gate insulation layer, and a first bulk metal layer positioned on the work function metal layer. The device further includes a gate structure of a long channel device including a second high-k gate insulation layer, a second work function metal layer positioned on the second high-k gate insulation layer, another first bulk metal layer positioned on the second work function metal layer, a second bulk metal layer, and a conductive etch stop layer positioned between the another first bulk metal layer and the second bulk metal layer.

BRIEF DESCRIPTION OF THE DRAWINGS

The disclosure may be understood by reference to the following description taken in conjunction with the accompanying drawings, in which like reference numerals identify like elements, and in which.

Figure 1A:
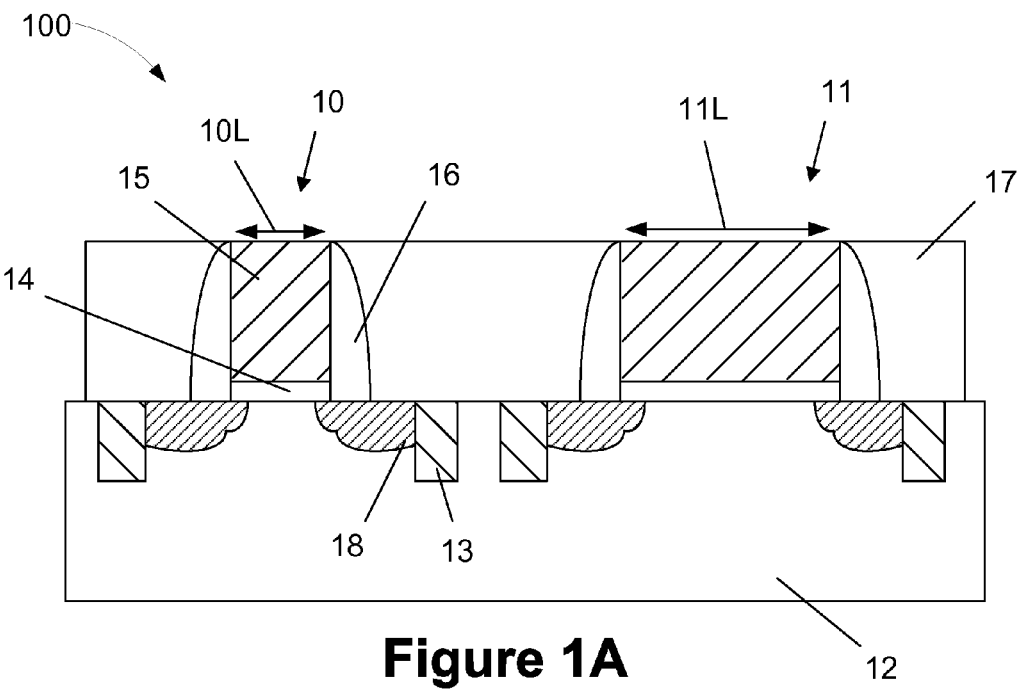
FIGS. 1A-1K depict various illustrative methods disclosed herein of forming gate structures of semiconductor devices and the resulting devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the disclosure as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure relates to various methods of forming gate structures of semiconductor devices and the resulting devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. Of course, the disclosure should not be considered limited to the illustrative examples depicted and described herein.

As will be appreciated by those skilled in the art after a complete reading of the present application, the disclosure may be employed in forming integrated circuit products using planar transistor devices, as well as so-called 3D devices, such as FinFETs, or a combination of such devices. For purposes of disclosure, reference will be made to an illustrative process flow wherein an integrated circuit product 100 is formed with a plurality of planar transistor devices 10, 11. However, the disclosure should not be considered limited to such an illustrative example. With reference to the attached figures, various illustrative embodiments of the methods and devices disclosed herein will now be described in more detail.

FIG. 1A is a simplified view of an illustrative integrated circuit product 100 at an early stage of manufacturing, wherein a pair of illustrative semiconductor devices 10, 11 have been formed in and above the semiconductor substrate 12. The substrate 12 may have a variety of configurations, such as the depicted bulk silicon configuration. The substrate 12 may also have a silicon-on-insulator (SOI) configuration that includes a bulk silicon layer, a buried insulation layer and an active layer, wherein the semiconductor devices 10, 11 are formed in and above the active layer. The substrate 12 may be made of silicon or it may be made of materials other than silicon. Thus, the terms "substrate" or "semiconductor substrate" should be understood to cover all semiconducting materials and all forms of such materials.

A replacement gate process may be used when forming the gate structures of planar devices or 3D devices. As shown in FIG. 1A, the process includes the formation of structures above an active area of the substrate 12 that is defined by shallow trench isolation structures 13. The various components and structures of the product 100 may be formed using a variety of different materials and by performing a variety of known techniques. The layers of material may be formed by any of a variety of different known techniques, e.g., a chemical vapor deposition (CVD) process, an atomic layer deposition (ALD) process, a thermal growth process, spin-coating techniques, etc. At the point of fabrication depicted in FIG. 1A, the integrated circuit product 100 includes two devices 10, 11 having different channel lengths 10L and 11L. More specifically, the device 10 is a "short channel" device, which, for purposes of this disclosure and the attached claims, shall be understood to be a transistor device wherein the gate length 10L is 40 nm or less. On the other hand, the device 11 is a "long channel" device, which, for purposes of this disclosure and the attached claims, shall be understood to be a transistor device wherein the gate length 11L is greater than 40 nm. Each device 10, 11 includes a sacrificial gate insulation layer 14, a dummy or sacrificial gate electrode 15, outermost sidewall spacers 16, a layer of insulating material 17 and source/drain regions 18 formed in the substrate 12. For simplicity, the two devices 10, 11 are depicted as being formed side-by-side on the substrate 12. However, in practice, the devices 10, 11 may be positioned remotely from one another on the substrate 12.

The various components and structures of the devices 10, 11 may be formed using a variety of different materials and by performing a variety of known techniques. For example, the sacrificial gate insulation layers 14 may be made of silicon dioxide, the sacrificial gate electrodes 15 may be made of polysilicon, the sidewall spacers 16 may be made of silicon nitride and the layer of insulating material 17 may be made of silicon dioxide. The source/drain regions 18 typically include implanted dopant materials (N-type dopants for NMOS devices and P-type dopants for PMOS devices) that are implanted into the substrate 12 using known masking and ion implantation techniques. At the point of fabrication depicted in FIG. 1A, various structures of the devices 10, 11 have been formed and a chemical mechanical polishing (CMP) process has been performed to remove any materials above the sacrificial gate electrodes 15 (such as a protective cap layer (not shown) made of silicon nitride) so that at least the sacrificial gate electrodes 15 may be removed.

Figure 1B:
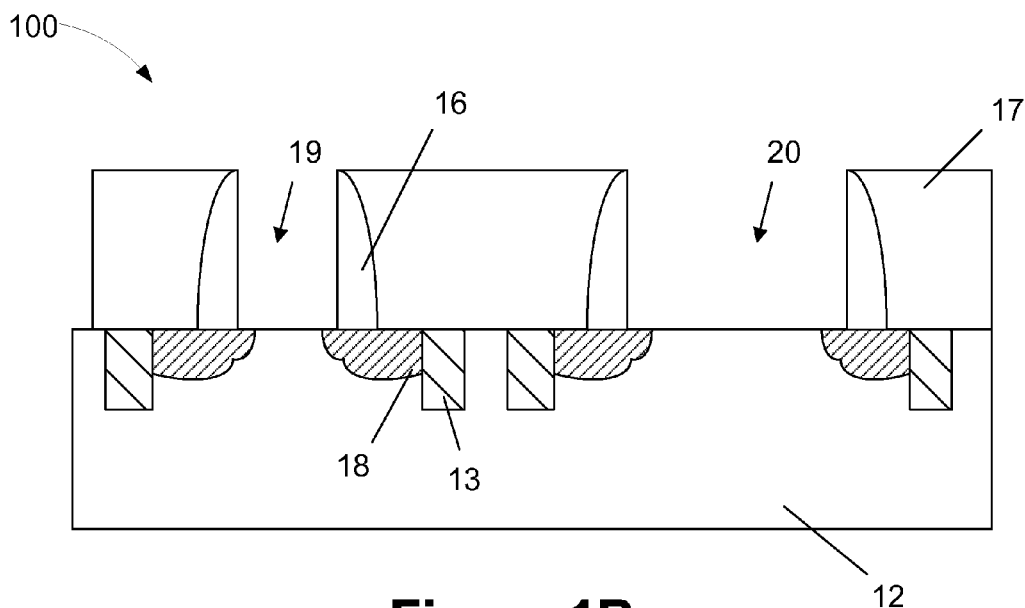

As shown in FIG. 1B, one or more etching processes were performed to remove the sacrificial gate electrodes 15 and the sacrificial gate insulation layers 14 to thereby define trenches or gate cavities 19, 20 where replacement gate structures will subsequently be formed. As shown, due to the difference in channel lengths 10L and 11L, the gate cavity 19 is narrower than the gate cavity 20. Typically, the sacrificial gate insulation layers 14 are removed as part of the replacement gate technique, as depicted herein. However, the sacrificial gate insulation layers 14 may not be removed in all applications.

Figure 1C:
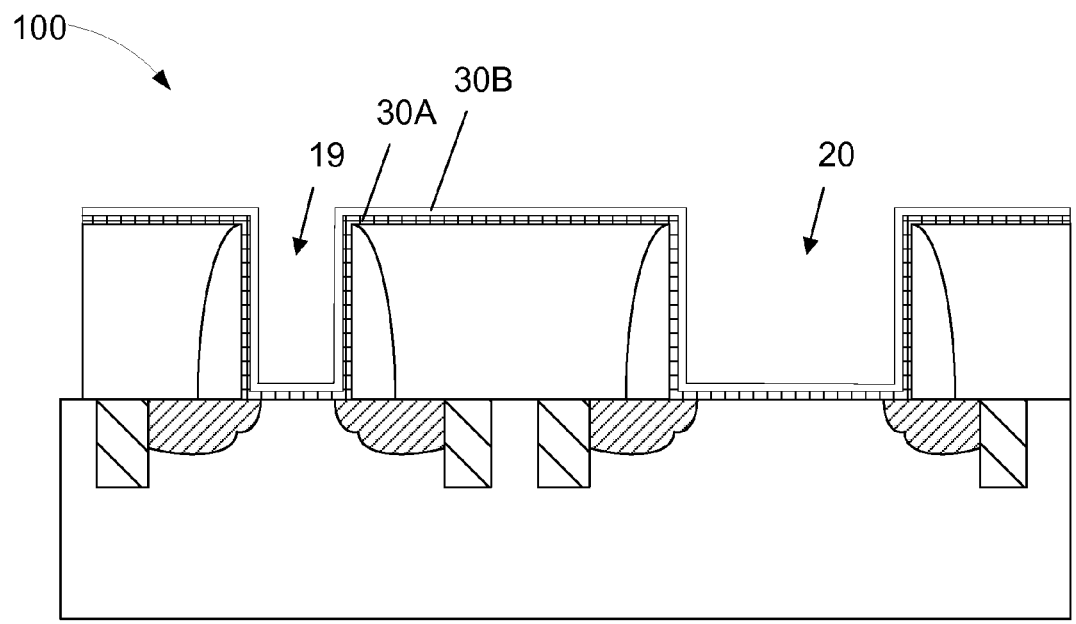

Next, as shown in FIGS. 1C-1F, various layers of material that will constitute replacement gate structures 30, 32 (shown in FIG. 1J) are formed in the gate cavities 19, 20. FIG. 1C illustrates the product 100 after various deposition processes have been performed. First, a high-k gate insulation layer 30A was conformably deposited onto the product 100 and within the gate cavities 19, 20. As used herein and in the attached claims, high-k materials have a dielectric constant, or k-value, of 10 or greater. As described above, the high-k gate insulation layer may 30A be made of various materials and deposited in various thicknesses in various embodiments. Next, a work function metal layer 30B was conformably deposited onto the product 100 and on the high-k gate insulation layer 30A within the gate cavities 19, 20. As described above, the work function metal layer 30B may be made of various materials and deposited in various thicknesses in various embodiments. In at least one embodiment, the work function metal layer 30B may be made of titanium nitride.

Figure 1D:
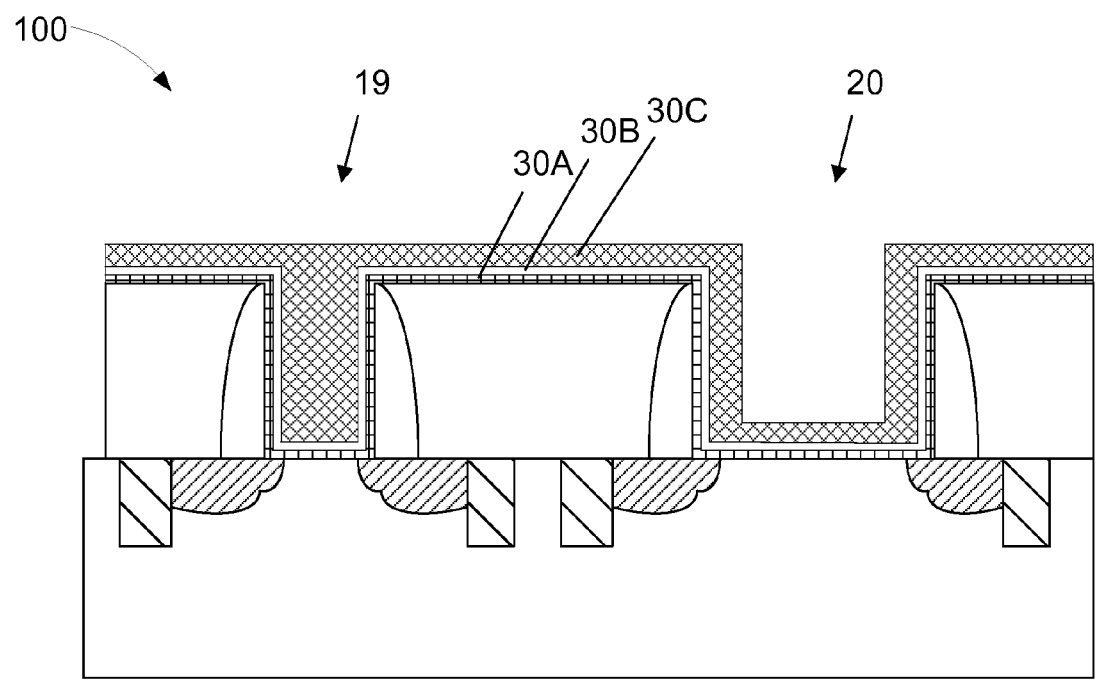

As shown in FIG. 1D, a first bulk metal layer 30C was deposited onto the product 100 and on the work function metal layer 30B. When deposited, the first bulk metal layer 30C overfills the narrower gate cavity 19, but does not overfill the larger gate cavity 20. As shown, in one embodiment, the first bulk metal layer 30C may be made of tungsten, and it may be deposited to a thickness of between 10-20 nm. However, in various other embodiments, the first bulk metal layer 30C may be made of other metals and it may be formed to different thicknesses as desired.

Figure 1E:
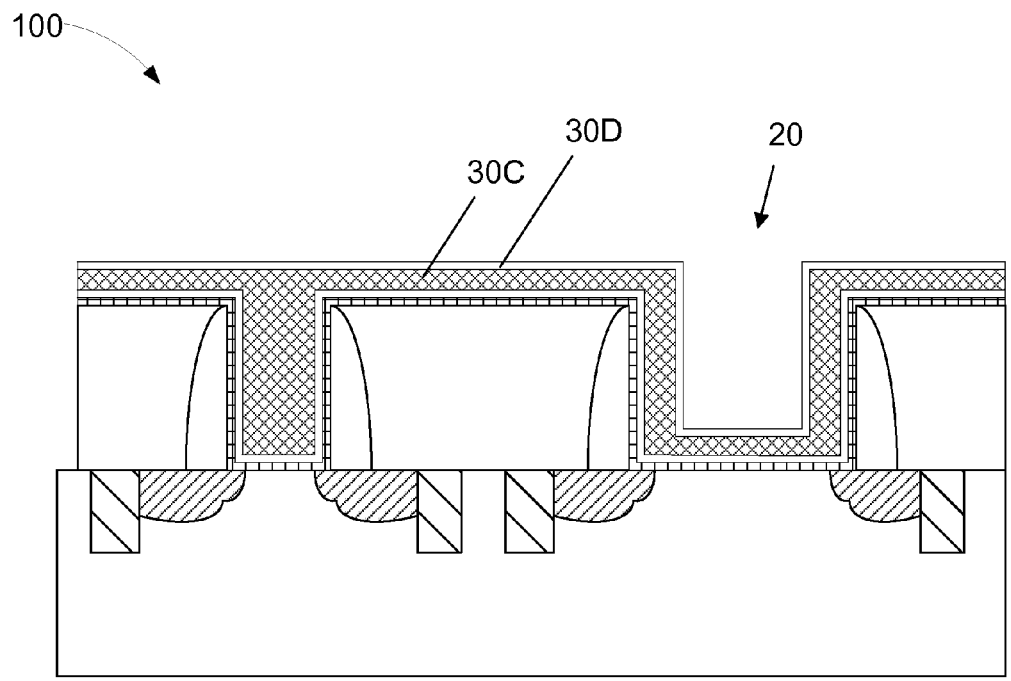

As shown in FIG. 1E, a conductive etch stop layer 30D was conformably deposited onto the product 100 on the first bulk metal layer 30C and within the wider gate cavity 20. In general, the conductive etch stop layer 30D should be made of a conductive material that provides good etch selectivity relative to another bulk metal layer that will be formed above the conductive etch stop layer 30D, as described more fully below. As shown, in one embodiment, the conductive etch stop layer 30D may be made of titanium nitride, and it may be deposited such that it has a thickness between 2 nm and 10 nm. However, in various other embodiments, the conductive etch stop layer 30D may be made of other conductive materials, such as titanium, titanium nitride, tantalum, tantalum nitride, tungsten nitride, aluminum, ruthenium, titanium silicon nitride and tantalum silicon nitride, and its thickness may be varied as desired. Since the conductive etch stop layer 30D is made of a conductive material—and not an insulating material—any increase in gate resistance is minimized. In at least one embodiment, the conductive etch stop layer 30D may be made of the same material as the work function metal layer 30B, e.g. titanium nitride, but such a situation is not required for all applications. Because the narrower gate cavity 19 was overfilled prior to the formation of the etch stop layer 30D, the conductive etch stop layer 30D is deposited into the wider gate cavity 20 but not the narrower gate cavity 19.

Figure 1F:
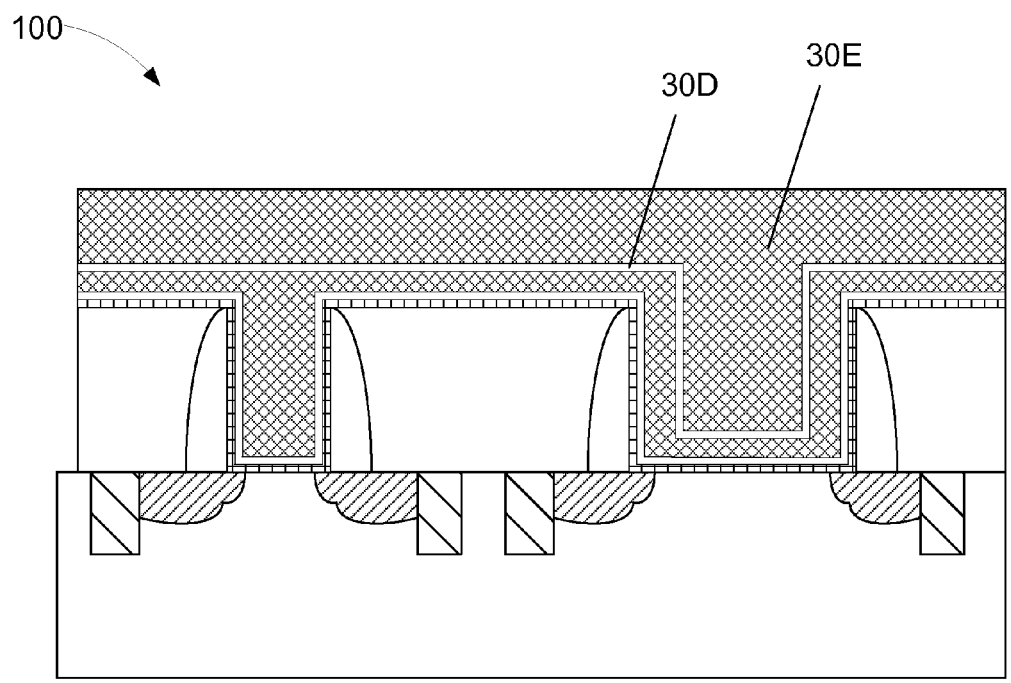

FIG. 1F depicts the product 100 after a second bulk metal layer 30E was deposited on the conductive etch stop layer 30D so as to overfill the wider gate cavity 20. In at least one embodiment, the second bulk metal layer 30E may be made of tungsten, and it may be deposited to any desired thickness. However, in various other embodiments, the second bulk metal layer 30E may be made of other conductive materials. As shown in the depicted example, the second bulk metal layer 30E is deposited thicker than the first bulk metal layer 30C, and both include tungsten. However, in other embodiments, the second bulk metal layer 30E may be made of a different material than the first bulk metal layer 30C.

Figure 1G:
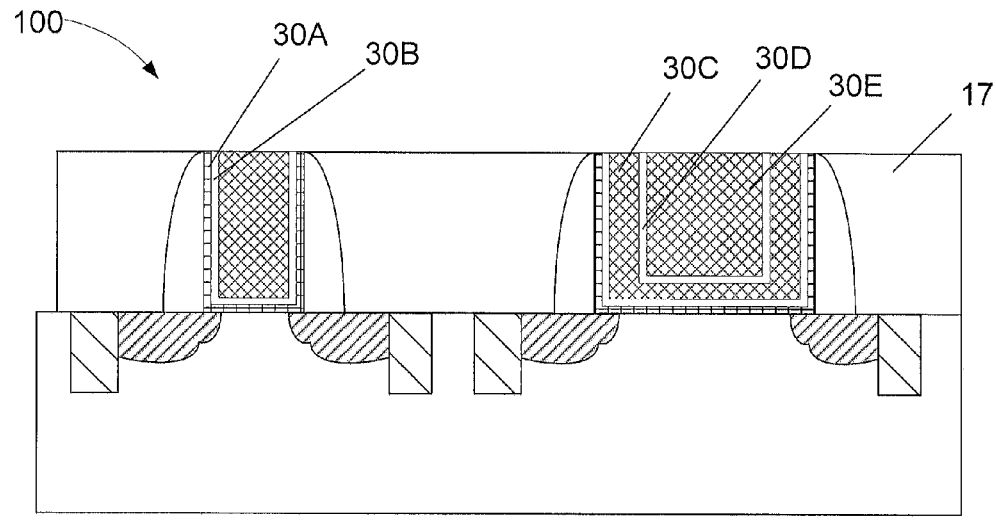

FIG. 1G depicts the product 100 after one or more CMP processes have been performed to planarize the product 100 using the insulating layer 17 as a polish-stop layer. These operations result in the removal of portions of the gate insulation layer 30A, the work function metal layer 30B, the first bulk metal layer 30C, the conductive etch stop layer 30D and the second bulk metal layer 30E outside of the gate cavities 19, 20. In various other embodiments, the CMP process may be performed to planarize the product 100 using the conductive etch stop layer 30D as a polish-stop layer. Next, the conductive etch stop layer 30D may be selectively polished. Next, another CMP process is performed using the work function metal layer 30B as a polish-stop layer. These operations result in the removal of portions of the first bulk metal layer 30C, conductive etch stop layer 30D and the second bulk metal layer 30E outside of the gate cavities 19, 20. In this embodiment, the high-k gate insulation layer 30A and work function metal layer 30B are removed from outside the gate cavities 19, 20 after the recessing performed in FIG. 1H and discussed below.

Figure 1H:
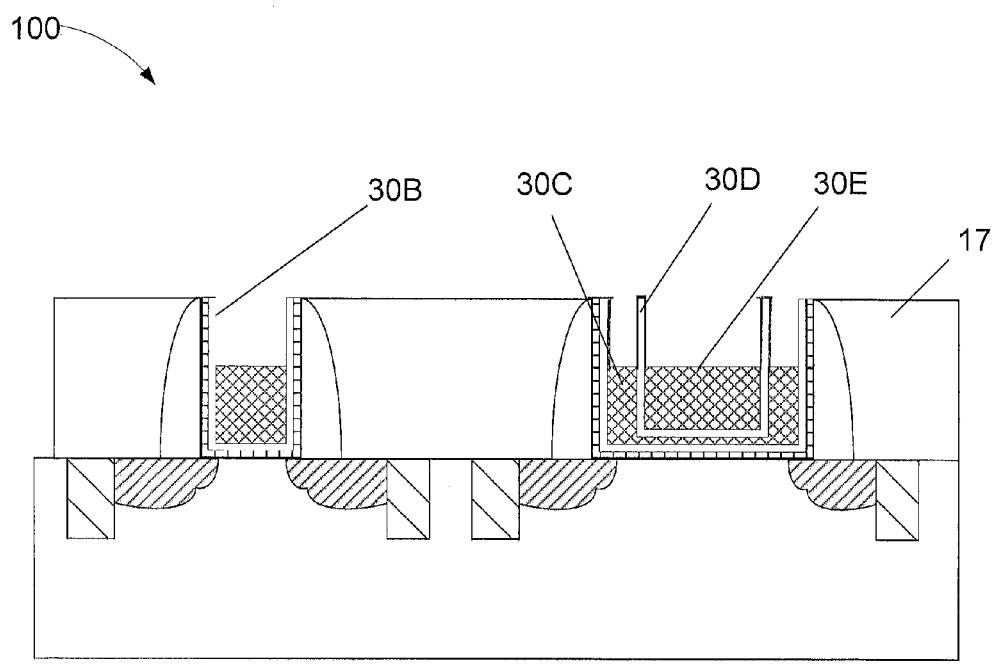

FIG. 1H depicts the product 100 after one or more recess etching processes were performed such that the first and second bulk metal layers 30C, 30E were etched and recessed selectively relative to the surrounding layers 30B, 30D. As shown, the etching process was a timed etching process that left a portion of the second bulk metal layer 30E intact above the conductive etch stop layer 30D. As noted previously, the etch rate of the first and second bulk metal layers 30C, 30E in the wider gate cavity 20 will typically be faster than the etch rate of the first bulk metal layer 30C in the narrower gate cavity 19 due to the larger grain size and surface area of tungsten in the wider gate cavity 20. However, for simplicity, any such difference in etching rates is not depicted in the resulting structures in the attached drawings.

Figure 1I:
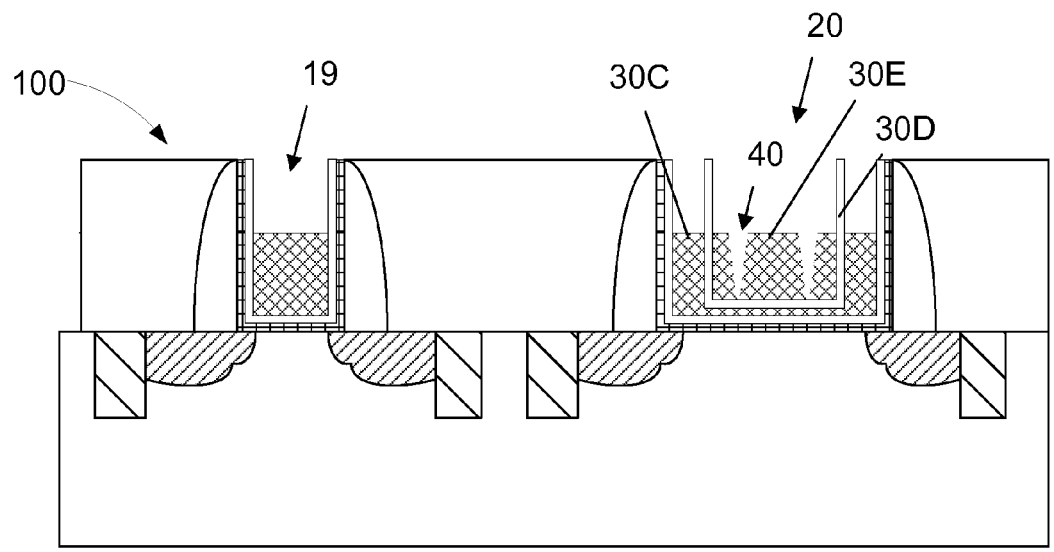

As shown in FIG. 1I, the recessing of the first and second bulk metal layers 30C, 30E may result in uneven etching within the second gate cavity 20 causing one or more notches or gouges 40 to be formed where portions of the second bulk metal layer 30E were etched faster than the surrounding portions. However, the presence of the conductive etch stop layer 30D prevented the first bulk metal layer 30C below the conductive etch stop layer 30D from being etched. Additionally, the presence of the conductive etch stop layer 30D allows for a greater window of time for performing the recess etching process to recess the first and second bulk metal layers 30C, 30E within both cavities 19, 20. In some applications, this means that the first and second bulk metal layers 30C, 30E may be recessed to approximately the same height. The presence of the conductive etch stop layer 30D also allows for the gate structures within the narrower gate cavity 19 and wider gate cavity 20 to be processed simultaneously, i.e., to be subjected to the recess etching process at the same time. Specifically, the recipe for the recess etching recipes may be the same for both short and long channel devices and it need not be adjusted based on the channel length of the different devices. Accordingly, the short channel devices and long channel devices do not have to be separately masked and etched when performing the recess etching process.

Figure 1J:
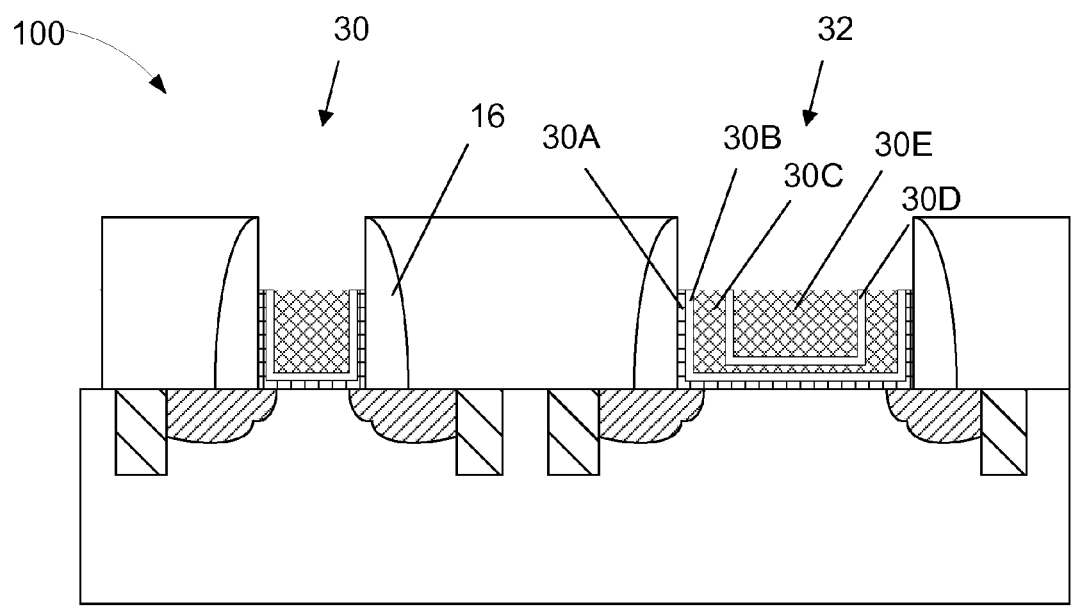

As shown in FIG. 1J (the notches or gouges 40 due to uneven etching are not shown), one or more etching processes were performed to selectively remove portions of the conductive etch stop layer 30D, the work function metal layer 30B and the high-k gate insulation layer 30A relative to the surrounding first and second bulk metal layers 30C, 30E and the sidewall spacer 16. In at least one embodiment, the same etching process may be performed to recess the conductive etch stop layer 30D and work function metal layer 30B simultaneously. As such, the replacement gate structures 30 (the narrower completed gate structure), 32 (the wider completed gate structure) have been defined. In at least one embodiment, the etching process was performed such that the surfaces of the completed replacement gate structures 30, 32 are relatively planar and approximately at the same height level. The wider completed gate structure 32 includes the recessed conductive etch stop layer 30D between the first bulk metal layer 30C and the recessed second bulk metal layer 30E in at least one embodiment. Of course, the materials used for the replacement gate structures may vary depending upon the application, and the materials for NMOS and PMOS devices are typically different.

Figure 1K:
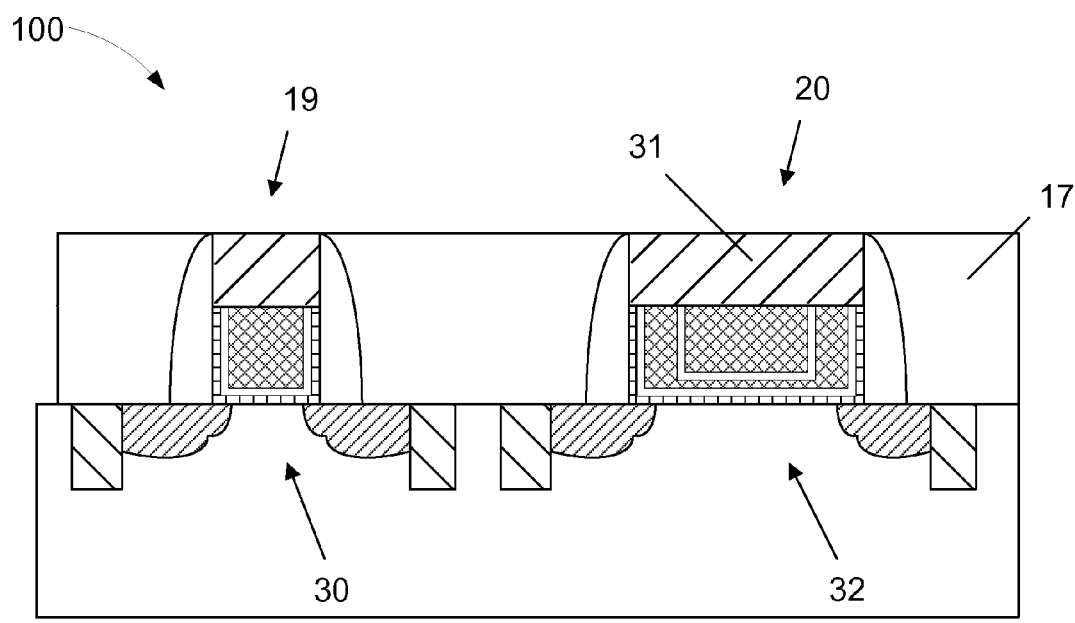

As shown in FIG. 1K, one or more deposition and CMP processes were performed to form gate cap layers 31 in the gate cavities 19, 20. Specifically, a layer of gate cap material, such as silicon nitride, was deposited onto the product 100 so as to overfill the cavities 19, 20 above the gate structures 30, 32. Next, a CMP process was performed to remove any excess material positioned above the surface of the layer of insulating material 17 and to planarize the surface of the product 100. The gate cap layers 31 were formed to protect the underlying gate materials during subsequent processing operations.

The particular embodiments disclosed above are illustrative only, as the disclosure may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the disclosure. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a replacement gate structure for a device, comprising:

forming a gate cavity above a semiconductor substrate;

forming a high-k gate insulation layer in said gate cavity above said semiconductor substrate;

forming a work function metal layer in said gate cavity above said high-k gate insulation layer;

forming a first bulk metal layer in said gate cavity above said work function metal layer;

forming a conductive etch stop layer in said gate cavity above said first bulk metal layer;

forming a second bulk metal layer in said gate cavity above said conductive etch stop layer;

performing at least one etching process to recess said first and second bulk metal layers selectively relative to said conductive etch stop layer; and performing at least one etching process to recess at least said conductive etch stop layer.

2. The method of claim 1, wherein, during the performance of said at least one etching process to recess said first and second bulk metal layers, said conductive etch stop layer prevents said first bulk metal layer below said conductive etch stop layer from being etched.

3. The method of claim 1, wherein said conductive etch stop layer comprises the same material as said work function metal layer, and wherein recessing said conductive etch stop layer comprises recessing said conductive etch stop layer and said work function metal layer simultaneously.

4. The method of claim 1, further comprising forming a gate cap layer above said recessed conductive etch stop layer and said recessed first and second bulk metal layers.

5. The method of claim 1, wherein said conductive etch stop layer comprises a material selected from the group consisting of titanium, titanium nitride, tantalum, tantalum nitride, tungsten nitride, aluminum, ruthenium, titanium silicon nitride and tantalum silicon nitride.

6. The method of claim 1, wherein said first bulk metal layer and said second bulk metal layer comprise tungsten.

7. The method of claim 1, wherein said first bulk metal layer comprises a different material than said second bulk metal layer.

8. A method of forming replacement gate structures for first and second devices, wherein said first device is a short channel device and said second device is a long channel device, the method comprising:

forming a first and a second gate cavity above a semiconductor substrate for said first and second devices, respectively, said first gate cavity being narrower than said second gate cavity;

forming a high-k gate insulation layer within said first and second gate cavities;

forming a work function metal layer within said first and second gate cavities above said high-k gate insulation layer;

forming a first bulk metal layer within said first and second gate cavities, wherein said first bulk metal layer overfills said first gate cavity but only partially fills said second gate cavity;

performing a conformal deposition process to form a conductive etch stop layer above said first bulk metal layer within said second gate cavity;

forming a second bulk metal layer above said conductive etch stop layer within said second gate cavity, wherein said second bulk metal layer overfills said second gate cavity;

performing at least one etching process to recess said first bulk metal layer within said first gate cavity and to recess said first and second bulk metal layers within said second gate cavity; and performing at least one etching process to recess said conductive etch stop layer within said second gate cavity.

9. The method of claim 8, wherein performing said at least one etching process to recess said first and second bulk metal layers comprises performing a timed etch such that said conductive etch stop layer prevents said first bulk metal layer below said conductive etch stop layer from being etched within said second gate cavity.

10. The method of claim 8, wherein said conductive etch stop layer comprises the same material as said work function metal layer, and wherein recessing said conductive etch stop layer comprises recessing said conductive etch stop layer and said work function metal layer simultaneously within said second gate cavity.

11. The method of claim 8, further comprising forming a gate cap layer above said conductive etch stop layer within said second gate cavity.

12. The method of claim 8, wherein said conductive etch stop layer comprises a material selected from the group consisting of titanium, titanium nitride, tantalum, tantalum nitride, tungsten nitride, aluminum, ruthenium, titanium silicon nitride and tantalum silicon nitride.

13. The method of claim 8, wherein said first bulk metal layer and said second bulk metal layer comprise tungsten.

* * * * *